(12) United States Patent
Zhu et al.

(10) Patent No.: US 11,081,623 B2
(45) Date of Patent: *Aug. 3, 2021

(54) OXYGEN CONTROLLED PVD ALN BUFFER FOR GAN-BASED OPTOELECTRONIC AND ELECTRONIC DEVICES

(71) Applicant: Applied Materials, Inc., Santa Clara, CA (US)

(72) Inventors: Mingwei Zhu, San Jose, CA (US); Nag B. Patibandla, Pleasanton, CA (US); Rongjun Wang, Dublin, CA (US); Daniel Lee Diehl, Chiba (JP); Vivek Agrawal, Fremont, CA (US); Anantha Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/721,301

(22) Filed: Dec. 19, 2019

(65) Prior Publication Data

US 2020/0127164 A1 Apr. 23, 2020

Related U.S. Application Data

(60) Continuation of application No. 16/265,895, filed on Feb. 1, 2019, now Pat. No. 10,546,973, which is a
(Continued)

(51) Int. Cl.
*H01L 33/12* (2010.01)
*H01J 37/34* (2006.01)
(Continued)

(52) U.S. Cl.
CPC ........ *H01L 33/12* (2013.01); *H01J 37/32467* (2013.01); *H01J 37/32724* (2013.01);
(Continued)

(58) Field of Classification Search
CPC . H01L 33/12; H01L 33/0075; H01L 29/2003; H01L 33/007; H01L 31/1856;
(Continued)

(56) References Cited

U.S. PATENT DOCUMENTS

| 5,237,182 A | 8/1993 | Kitagawa et al. |
| 5,267,607 A | 12/1993 | Wada |

(Continued)

FOREIGN PATENT DOCUMENTS

| CN | 101442030 | 5/2009 |
| CN | 101874306 | 10/2010 |

(Continued)

OTHER PUBLICATIONS

Non-Final Office Action from U.S. Appl. No. 14/884,251 dated Oct. 26, 2017, 10 pgs.

(Continued)

*Primary Examiner* — Latanya N Crawford Eason
(74) *Attorney, Agent, or Firm* — Schwabe, Williamson & Wyatt, P.C.

(57) ABSTRACT

Oxygen controlled PVD AlN buffers for GaN-based optoelectronic and electronic devices is described. Methods of forming a PVD AlN buffer for GaN-based optoelectronic and electronic devices in an oxygen controlled manner are also described. In an example, a method of forming an aluminum nitride (AlN) buffer layer for GaN-based optoelectronic or electronic devices involves reactive sputtering an AlN layer above a substrate, the reactive sputtering involving reacting an aluminum-containing target housed in a physical vapor deposition (PVD) chamber with a nitrogen-containing gas or a plasma based on a nitrogen-containing gas. The method further involves incorporating oxygen into the AlN layer.

8 Claims, 9 Drawing Sheets

Related U.S. Application Data continuation of application No. 15/980,583, filed on May 15, 2018, now Pat. No. 10,236,412, which is a division of application No. 14/884,251, filed on Oct. 15, 2015, now Pat. No. 10,193,014, which is a division of application No. 13/947,857, filed on Jul. 22, 2013, now Pat. No. 9,929,310.

(60) Provisional application No. 61/785,128, filed on Mar. 14, 2013.

(51) Int. Cl.
| | |
|---|---|
| *H01L 31/18* | (2006.01) |
| *H01L 33/00* | (2010.01) |
| *H01J 37/32* | (2006.01) |
| *H01L 29/20* | (2006.01) |

(52) U.S. Cl.
CPC ........ *H01J 37/3405* (2013.01); *H01J 37/347* (2013.01); *H01L 29/2003* (2013.01); *H01L 31/1856* (2013.01); *H01L 33/007* (2013.01); *H01L 33/0075* (2013.01); *Y02E 10/544* (2013.01)

(58) Field of Classification Search
CPC ............... H01J 37/347; H01J 37/32467; H01J 37/32724; H01J 37/3405; Y02E 10/544
See application file for complete search history.

(56) References Cited

U.S. PATENT DOCUMENTS

| | | | |
|---|---|---|---|
| 5,677,231 | A | 10/1997 | Maniar et al. |
| 5,686,738 | A | 11/1997 | Moustakas |
| 6,533,874 | B1 | 3/2003 | Vaudo et al. |
| 6,692,568 | B2 | 2/2004 | Cuomo et al. |
| 6,737,240 | B1 | 5/2004 | Xu et al. |
| 6,784,085 | B2 | 8/2004 | Cuomo et al. |
| 7,642,693 | B2 | 1/2010 | Akiyama et al. |
| 7,968,361 | B2 | 6/2011 | Osawa et al. |
| 8,198,179 | B2 | 6/2012 | Sasaki et al. |
| 8,409,895 | B2 | 4/2013 | Zhu et al. |
| 8,592,240 | B2 | 11/2013 | Kusunoki |
| 8,647,904 | B2 | 2/2014 | Araki et al. |
| 8,704,239 | B2 | 4/2014 | Kinoshita et al. |
| 9,252,322 | B2 | 2/2016 | Daigo et al. |
| 9,297,093 | B2 | 3/2016 | Kinoshita et al. |
| 2001/0032783 | A1 | 10/2001 | Gopalraja et al. |
| 2002/0149024 | A1 | 10/2002 | Kato et al. |
| 2003/0042496 | A1 | 3/2003 | Sasaoka |
| 2003/0042505 | A1 | 3/2003 | Ito et al. |
| 2003/0127322 | A1 | 7/2003 | Shimakawa et al. |
| 2003/0134447 | A1 | 7/2003 | Shibata et al. |
| 2004/0079949 | A1 | 4/2004 | Chiyo et al. |
| 2006/0102926 | A1 | 5/2006 | Kikkawa et al. |
| 2007/0096123 | A1 | 5/2007 | Utsumi et al. |
| 2007/0138505 | A1 | 6/2007 | Preble et al. |
| 2007/0215983 | A1 | 9/2007 | Kim et al. |
| 2007/0246802 | A1 | 10/2007 | Xianyu et al. |
| 2007/0251819 | A1 | 11/2007 | Kardokus et al. |
| 2007/0261951 | A1 | 11/2007 | Ye et al. |
| 2009/0061254 | A1 | 3/2009 | Goela et al. |
| 2009/0114933 | A1 | 5/2009 | Osawa et al. |
| 2009/0191695 | A1 | 7/2009 | Park et al. |
| 2009/0283795 | A1 | 11/2009 | Miki et al. |
| 2009/0286342 | A1 | 11/2009 | Takahashi et al. |
| 2010/0006430 | A1 | 1/2010 | Miki et al. |
| 2010/0055318 | A1 | 3/2010 | Volf et al. |
| 2010/0127336 | A1 | 5/2010 | Chambers et al. |
| 2010/0176369 | A2 | 7/2010 | Oliver et al. |
| 2010/0219445 | A1 | 9/2010 | Yokoyama et al. |
| 2010/0273318 | A1 | 10/2010 | Melnik et al. |
| 2010/0308300 | A1 | 12/2010 | Pan |
| 2011/0012109 | A1 | 1/2011 | Kryliouk et al. |
| 2011/0117376 | A1 | 5/2011 | Zhu et al. |
| 2011/0171758 | A1 | 7/2011 | Su et al. |
| 2011/0198567 | A1 | 8/2011 | Shinohara et al. |
| 2011/0244663 | A1 | 10/2011 | Su |
| 2012/0076968 | A1 | 3/2012 | Dmitriev et al. |
| 2012/0175589 | A1 | 7/2012 | Ooshika et al. |
| 2012/0223329 | A1 | 9/2012 | Kinoshita et al. |
| 2012/0319162 | A1 | 12/2012 | Araki et al. |
| 2012/0325310 | A1 | 12/2012 | Chichibu et al. |
| 2013/0098455 | A1 | 4/2013 | Ng et al. |
| 2013/0277684 | A1 | 10/2013 | Araki et al. |
| 2013/0285065 | A1 | 10/2013 | Zhu et al. |
| 2014/0054593 | A1 | 2/2014 | Liao et al. |
| 2015/0348773 | A1 | 12/2015 | Zhu et al. |

FOREIGN PATENT DOCUMENTS

| | | |
|---|---|---|
| JP | H09143708 | 6/1997 |
| JP | H11-340165 | 12/1999 |
| JP | 2003059625 | 2/2003 |
| JP | 2004168622 | 6/2004 |
| JP | 2004346336 | 12/2004 |
| JP | 2006347776 | 12/2006 |
| JP | 2008135463 | 6/2008 |
| JP | 2010518615 | 5/2010 |
| JP | 2012136756 | 7/2012 |
| JP | WO 2011/108422 | 6/2013 |
| JP | WO 2012/090818 | 6/2014 |
| WO | WO 2011/058968 | 5/2011 |
| WO | WO 2011/108422 | 6/2013 |
| WO | WO 2011/037251 | 4/2017 |

OTHER PUBLICATIONS

Non-Final Office Action from U.S. Appl. No. 14/884,251 dated Dec. 29, 2016, 12 pgs.
Non-Final Office Action from U.S. Appl. No. 14/884,251 dated Mar. 11, 2016, 11 pgs.
Final Office Action from U.S. Appl. No. 14/884,251 dated Sep. 8, 2016, 9 pgs.
Final Office Action from U.S. Appl. No. 14/884,251 dated Jul. 12, 2017, 16 pgs.
Non-Final Office Action from U.S. Appl. No. 13/947,857 dated May 16, 2017, 9 pgs.
Final Office Action from U.S. Appl. No. 13/947,857 dated Jan. 30, 2017, 15 pgs.
Non-Final Office Action from U.S. Appl. No. 13/947,857 dated Mar. 12, 2015, 11 pgs.
Final Office Action from U.S. Appl. No. 13/947,857 dated May 18, 2016, 12 pgs.
Final Office Action from U.S. Appl. No. 13/947,857 dated Jul. 17, 2015, 10 pgs.
Final Office Action from U.S. Appl. No. 13/947,857 dated Aug. 18, 2016, 11 pgs.
Non-Final Office Action from U.S. Appl. No. 13/947,857 dated Nov. 2, 2015, 10 pgs.
Final Office Action for U.S. Appl. No. 14/884,251 dated May 31, 2018, 26 pgs.
Notice of First Office Action from Chinese Patent Application No. 201380074273.4 dated Feb. 24, 2017, 9 pgs.
Notice of Second Office Action from Chinese Patent Application No. 201380074273.4 dated Sep. 27, 2017, 4 pgs.
Notice of Third Office Action from Chinese Patent Application No. 201380074273.4 dated Mar. 14, 2018, 5 pgs.
Office Action from Chinese Patent Application No. 201380074273.4 dated Aug. 28, 2018, 6 pgs.
Notice of Reasons for Rejection from Japanese Patent Application No. 2016-500086 dated May 23, 2017, 6 pgs.
Notice of Office Action from Taiwan Patent Application No. 102127333 dated Sep. 8, 2017, 8 pgs.
International Search Report and Written Opinion from PCT/US2013/053994 dated Nov. 26, 2013, 10 pgs.
International Preliminary Report on Patentability from PCT/US2013/053994 dated Sep. 24, 2015, 7 pgs.

(56) References Cited

OTHER PUBLICATIONS

Jagannadham, K. et al., "Structural characteristics of AlN films deposed by pulsed laser deposition and reactive magnetron sputtering: A comparative study," J. Vac. Sci. Technol. A 16(5), Sep./Oct. 1998, 2804-2815.
Office Action from Korean Patent Application No. 10-2015-7028842 dated Jun. 10, 2019, 19 pgs.
Preliminary Rejection from Korean Patent Application No. 10-2020-7004748 dated May 17, 2020, 5 pgs.
Notification of Reexamination of Chinese Patent Application No. 201380074273 dated Mar. 26, 2020, 9 pgs.
Second Notification of Reexamination from Chinese Patent Application No. 201380074273.4 dated Aug. 23, 2020, 4 pgs.
Preliminary Rejection from Korean Patent Application No. 10-2021-7001822 dated Mar. 21, 2021, 5 pgs.
Notice of Fourth Office Action from Chinese Patent Application No. 201380074273.4 dated Apr. 9, 2021, 13 pgs.

OXYGEN CONTROLLED PVD ALN BUFFER FOR GAN-BASED OPTOELECTRONIC AND ELECTRONIC DEVICES

CROSS-REFERENCE TO RELATED APPLICATIONS

This application is a continuation of U.S. patent application Ser. No. 16/265,895, filed Feb. 1, 2019, which is a continuation of U.S. patent application Ser. No. 15/980,583, filed May 15, 2018, now U.S. Pat. No. 10,236,412, issued Mar. 19, 2019, which is a divisional of U.S. patent application Ser. No. 14/884,251, filed Oct. 15, 2015, now U.S. Pat. No. 10,193,014, issued Jan. 29, 2019, which is a divisional of U.S. patent application Ser. No. 13/947,857, filed Jul. 22, 2013, now U.S. Pat. No. 9,929,310, issued Mar. 27, 2018, which claims the benefit of U.S. Provisional Application No. 61/785,128, filed Mar. 14, 2013, the entire contents of which are hereby incorporated by reference herein.

BACKGROUND

1) Field

Embodiments of the present invention pertain to the field of group III-nitride materials and, in particular, to the fabrication of gallium nitride-based optoelectronic or electronic devices with physical vapor deposition (PVD) formed aluminum nitride buffer layers.

2) Description of Related Art

Group III-V materials are playing an ever increasing role in the semiconductor and related, e.g. light-emitting diode (LED), industries. Often, group III-V materials are difficult to grow or deposit on foreign substrates (known as heteroepitaxy) without the formation of defects or cracks. For example, high quality surface preservation of select films, e.g. a gallium nitride film, is not straightforward in many applications using stacks of material layers fabricated sequentially. The inclusion of one or more buffer layers between a substrate and a device layer has been one approach. However, group III-V materials are often sensitive to process conditions and care must be taken to avoid such conditions at particular periods of the fabrication process. Avoiding interaction of a sensitive group III-V film with potential damaging conditions, however, is also not straightforward in many applications.

SUMMARY

One or more embodiments of the present invention are directed to physical vapor deposition (PVD)-formed aluminum nitride buffer layers.

In an embodiment, a method of forming an aluminum nitride (AlN) buffer layer for GaN-based optoelectronic or electronic devices involves reactive sputtering an AlN layer above a substrate, the reactive sputtering involving reacting an aluminum-containing target housed in a physical vapor deposition (PVD) chamber with a nitrogen-containing gas or a plasma based on a nitrogen-containing gas. The method further involves incorporating oxygen into the AlN layer.

In another embodiment, a material stack for GaN-based optoelectronic or electronic devices includes a substrate, and an aluminum nitride (AlN) buffer layer disposed above the substrate. The AlN layer has a concentration of oxygen approximately in the range of 1E18 to 1E23 $cm^{-3}$.

In another embodiment, a light-emitting diode (LED) device includes a substrate, and an aluminum nitride (AlN) buffer layer disposed above the substrate. The AlN layer has a concentration of oxygen approximately in the range of 1E18 to 1E23 $cm^{-3}$.

In another embodiment, a GaN-based electronic device includes a substrate, and an aluminum nitride (AlN) buffer layer disposed above the substrate. The AlN layer includes a concentration of oxygen approximately in the range of 1E18 to 1E23 $cm^3$.

In another embodiment, a chamber for forming an aluminum nitride (AlN) buffer layer for GaN-based optoelectronic or electronic devices includes a pumping system and chamber cooling design that enables high base vacuum of 1E-7 torr or less and low rate-of-rise at high temperature. The chamber also includes a full face erosion magnetron cathode configured to enable consistent target erosion and uniform deposition of AlN film across carriers, within and between wafers. The chamber also includes a process kit and gas flow design configured to enable a uniform distribution of process gases, including O-containing gas, within the chamber for uniform AlN composition.

DETAILED DESCRIPTION

Figure 1:
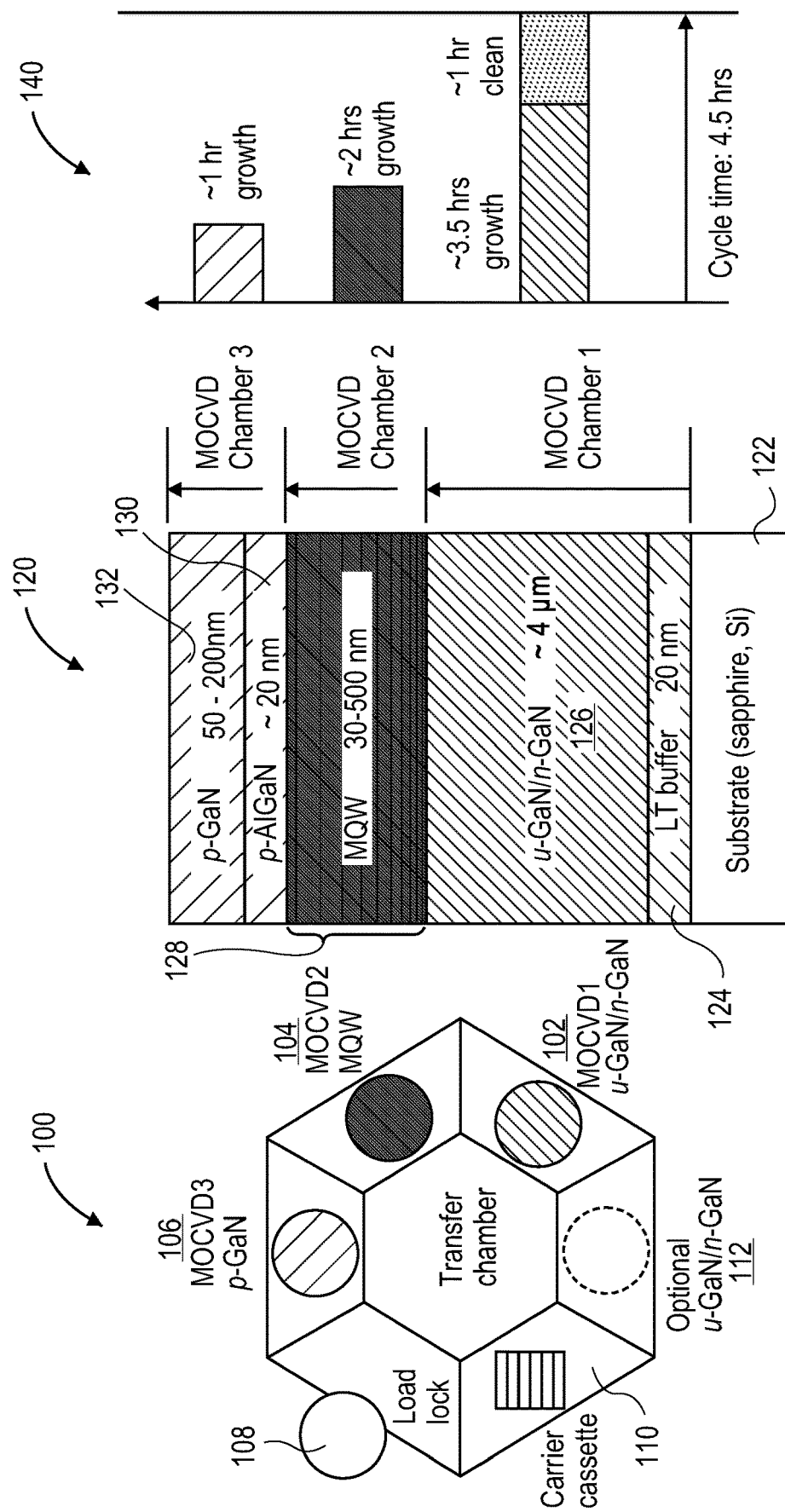
FIG. 1 illustrates a benchmark cluster tool schematic, a benchmark LED structure, and a benchmark time-to-deposition plot, in accordance with one or more embodiments of the present invention.

The fabrication of gallium nitride-based optoelectronic or electronic devices with physical vapor deposition (PVD) formed aluminum nitride (AlN) buffer layers is described. In the following description, numerous specific details are set forth, such as process chamber configurations and material regimes, in order to provide a thorough understanding of embodiments of the present invention. It will be apparent to one skilled in the art that embodiments of the present invention may be practiced without these specific details. In other instances, well-known features, such as specific diode configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

One or more embodiments are directed to oxygen controlled physical vapor deposition (PVD) based aluminum nitride (AlN) buffer layers for gallium nitride (GaN)-based optoelectronic and electronic devices. Embodiments may also include metal organic chemical vapor deposition (MOCVD) processes used to form layers on the PVD AlN film. Embodiments may be directed to lights emitting diodes (LEDs) or power devices. Features corresponding to one or more embodiments may include, or may implicate, sapphire substrates, patterned sapphire substrates, Si substrates, XRD, wafer bowing, film stress, and dislocations.

PVD AlN can be used as a buffer layer for GaN-based LEDs and power devices grown on a foreign substrate, such as a sapphire or silicon substrate. Use of a PVD AlN layer can improve the material quality of gallium nitride (GaN) layers grown on top of the AlN buffer. Improved GaN can be used to achieve improved device performance (e.g., brightness, IQE, device leakage and ESD in the case of LEDs, and higher breakdown voltage in the case of power devices) as well as reliability.

To provide context, in a typical MOCVD growth of GaN on a sapphire substrate, the use of PVD AlN buffer can eliminate operations of substrate pre-baking, low temperature GaN buffer and a big portion of temperature ramping, and enable fast growth and thinner device layers. Altogether, processing time can be reduced by saving cycle time by 1 to 3 hrs. For growth of GaN on silicon, where an AlN layer is necessary to protect a silicon substrate from gallium attack, PVD AlN can save about 3 to 6 hours of epitaxial process and chamber cleaning time combined. Such process time reduction can greatly enhance the system throughput. Thus, in accordance with embodiments of the present invention, the crystal quality of PVD AlN directly impacts the material quality of GaN grown on top of it.

As such, as described herein, one or more embodiments of the present invention provide process details, system, chamber and hardware configurations to achieve an AlN buffer layer that repeatedly leads to superior GaN properties.

More specifically, embodiments of the present invention described herein involve doping of an AlN layer with oxygen via introduction of an oxygen-containing gas prior to, during, or after AlN deposition to modify the properties, including chemical bonds, crystal structure, grain size and shape, and/or morphology of the AlN/substrate interface, AlN bulk film and AlN surface. In one such embodiment, not only the oxygen concentration but also the time and duration of oxygen carrier introduction into a corresponding PVD chamber (e.g., for AlN formation) influence the quality of a subsequently formed GaN layer deposited thereon.

In an embodiment, applicable variables change depending on whether the starting substrate is planar or patterned (e.g., in the case of sapphire). When the oxygen concentration, flow rate, time of introduction, and other parameters (e.g., temperature, thickness, etc.) are optimized, growth of very high-quality AlN film is enabled. For example, in a specific embodiment, an AlN film with XRD (002) FWHM <15 arcsec and surface roughness <2 nm (root mean square) can be deposited. As a result, in a particular embodiment, GaN growth on foreign substrates with such buffer layers have much reduced dislocation density and narrower XRD FWHM (e.g., (002)<100 arcsec, (102)<150 arcsec). In a specific embodiment, the dislocation density is less than approximately 5E8 defects/cm$^2$. In an embodiment, XRD FWHM for (002) is approximately in the range of 50-250 arcsec. In an embodiment, XRD FWHM for (102) is approximately in the range of 70-250 arcsec. Embodiments of the invention are also directed to optimized hardware that enables high deposition rate, high precision control of temperature and gas composition that enables uniform modification of AlN interface, bulk and surface properties to ensure same high quality GaN achieved within the wafer and wafer to wafer.

An LED or power device method of fabrication can include the formation of a buffer layer of gallium nitride between a substrate and a device layer of un-doped and/or doped gallium nitride. In embodiments described herein, an aluminum nitride buffer layer is used in place of such a gallium nitride buffer layer, between the substrate and the device layer of un-doped and doped gallium nitride. The aluminum nitride layer may be formed by sputter deposition in a PVD process. This is different from traditional fabrication of group III-nitride buffer layers which is typically performed in a metal-organic vapor deposition (MOCVD) chamber, a molecular beam epitaxy (MBE) chamber, or a hydride vapor phase epitaxy (HVPE) chamber. The aluminum nitride layer may be formed by non-reactive sputtering from an aluminum nitride target housed in the PVD chamber or, alternatively, may be formed by reactive sputtering from an aluminum target housed in the PVD chamber and reacted with a nitrogen-containing gas or a plasma based on a nitrogen-containing gas.

In accordance with one or more embodiments, process conditions for PVD AlN buffer layers for GaN-based devices are described herein. One or more of the embodiments described herein may enable higher throughput in a multi-chamber fabrication tool used for LED or power device fabrication. Also, by including a PVD-formed aluminum nitride layer instead of a gallium nitride buffer layer, the device layer of un-doped and doped gallium nitride may be thinned overall. In a particular example, the un-doped portion may be thinned or eliminated altogether. Furthermore, preliminary sputter cleaning of a receiving substrate, such as a sapphire substrate, may be performed in the same PVD deposition chamber as is used to deposit the aluminum nitride layer. Additionally, the overall thermal budget of LED or power device fabrication may be reduced since the PVD aluminum nitride layer may be formed at temperatures below 300 degrees Celsius. By contrast, a typical gallium nitride or aluminum nitride MOCVD buffer layer is formed between 500-600 degrees Celsius. One or more of the embodiments described herein may enable faster deposition rates, e.g. two times the growth rate, for materials such as un-doped and/or n-type doped gallium nitride. Faster rates may be achieved since, in some embodiments, the un-doped and/or n-type doped gallium nitride layers are formed on an aluminum nitride (AlN) buffer layer which may provide an improved crystal orientation and morphological relationship for growing un-doped and/or n-type doped gallium nitride layers thereon. One or more of the embodiments described herein may enable an improvement of gallium nitride crystalline quality by forming the gallium nitride on a PVD-formed aluminum nitride buffer layer.

Embodiments of the present invention may provide improvements over a benchmark system or methodology developed during studies of the presently described systems and methodologies. For example, FIG. 1 illustrates a benchmark cluster tool schematic, a benchmark LED structure, and a benchmark time-to-deposition plot, in accordance with one or more embodiments of the present invention.

Referring to FIG. 1, a benchmark cluster tool 100 includes an un-doped and/or n-type gallium nitride MOCVD reaction chamber 102 (MOCVD1: u-GaN/n-GaN), a multiple quantum well (MQW) MOCVD reaction chamber 104 (MOCVD2: MQW), and a p-type gallium nitride MOCVD reaction chamber 106 (MOCVD3: p-GaN). The benchmark cluster tool 100 may also include a load lock 108, a carrier cassette 110, and an optional additional un-doped and/or n-type gallium nitride MOCVD reaction chamber 112 for high volume applications, all of which are depicted in FIG. 1.

A benchmark LED structure 120 includes a stack of various material layers, many of which include III-V materials. For example, the benchmark LED structure 120 includes a silicon or sapphire substrate 122 (Substrate: sapphire, Si), a 20 nanometer thick buffer layer 124 (LT buffer), and an approximately 4 microns thick un-doped/n-type gallium nitride combination layer 126 (u-GaN/n-GaN). The buffer layer 124 may be a gallium nitride layer formed at relatively low processing temperatures. The buffer layer 124 and the un-doped/n-type gallium nitride combination layer 126 are formed in un-doped and/or n-type gallium nitride MOCVD reaction chamber 102 of benchmark cluster tool 100. The benchmark LED structure 120 also includes an MQW structure 128 with a thickness in the range of 30-500 nanometers. The MQW structure 128 is formed in MQW MOCVD reaction chamber 104 of benchmark cluster tool 100. The benchmark LED structure 120 also includes an approximately 20 nanometers thick p-type gallium aluminum nitride layer 130 (p-AlGaN) and a p-type gallium nitride layer 132 with a thickness in the range of 50-200 nanometers (p-GaN). The p-type gallium aluminum nitride layer 130 and the p-type gallium nitride layer 132 are formed in p-type gallium nitride MOCVD reaction chamber 106 of benchmark cluster tool 100.

A benchmark time-to-deposition plot 140 represents chamber usage in benchmark cluster tool 100. The formation of the MQW structure 128 in MQW MOCVD reaction chamber 104 has a growth time of approximately 2 hours. And, the formation of the p-type gallium aluminum nitride layer 130 and the p-type gallium nitride layer 132 in p-type gallium nitride MOCVD reaction chamber 106 has a growth time of approximately 1 hour. Meanwhile, the formation of the buffer layer 124 and the un-doped/n-type gallium nitride combination layer 126 in un-doped and/or n-type gallium nitride MOCVD reaction chamber 102 has a growth time of approximately 3.5 hours. An additional approximately 1 hour may be required for chamber cleaning of chamber 102. Thus, overall, the cycle time for fabricating benchmark LED structure 120 in benchmark cluster tool 100 is dictated by the cycle time of un-doped and/or n-type gallium nitride MOCVD reaction chamber 102, which is approximately 4.5 hours. It is to be understood that cleaning time may, but need not, include time for shut-down, plus clean time, plus recovery time. It is also to be understood that the above may represent an average since cleaning may not be performed between every chamber usage.

A benchmark timing sequence for LED material deposition specific to the formation of the buffer layer 124 and the un-doped/n-type gallium nitride combination layer 126 in un-doped and/or n-type gallium nitride MOCVD reaction chamber 102, as described in association with FIG. 1, is provided below. For example, the growth time of approximately 3.5 hours is broken into a 10 minute high temperature treatment of a sapphire substrate, a 5 minute low temperature formation of a buffer layer, a 10 minute buffer annealing operation, a 30 minute growth recovery operation, a 2 hour un-doped/n-type gallium nitride combination layer formation operation, and a 30 minute temperature ramp and stabilization operation (e.g., temp ramp 2-3° C./s).

In reference to the benchmark systems and methodologies described in association with FIG. 1, the benchmark approach may result in an unbalanced time flow for each functioning layer of the LED. For example, formation of the buffer layer 124 and the un-doped/n-type gallium nitride combination layer 126 in un-doped and/or n-type gallium nitride MOCVD reaction chamber 102 is 3.5 hrs, formation of the MQW structure 128 in MQW MOCVD reaction chamber 104 is 2 hours, and formation of the p-type gallium aluminum nitride layer 130 and the p-type gallium nitride layer 132 in p-type gallium nitride MOCVD reaction chamber 106 is 1 hour. Furthermore, as mentioned above, an additional approximately 1 hour of chamber cleaning (possibly including pump-down times) may be required between runs in un-doped and/or n-type gallium nitride MOCVD reaction chamber 102. Such additional chamber cleaning may be required to avoid substrate contamination. As such, the progressive growth of the structure 120 with three MOCVD chambers results in significant idle time for the MQW MOCVD reaction chamber 104 and the p-type gallium nitride MOCVD reaction chamber 106, reducing the overall throughput of the system 100.

Figure 2A:
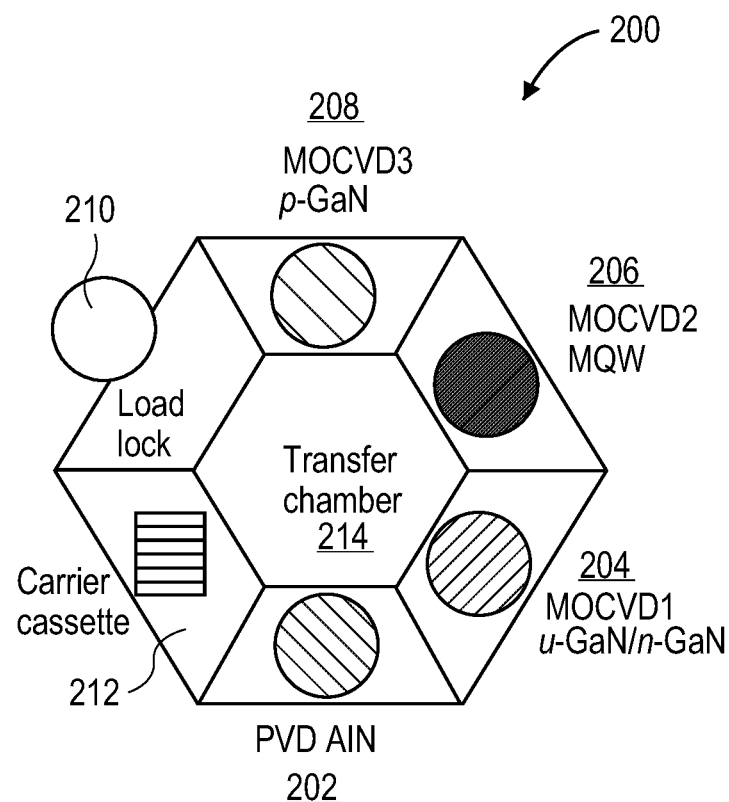
FIG. 2A illustrates a cluster tool schematic and a corresponding temperature versus time plot for LED structure fabrication, in accordance with an embodiment of the present invention.
Figure 2A:
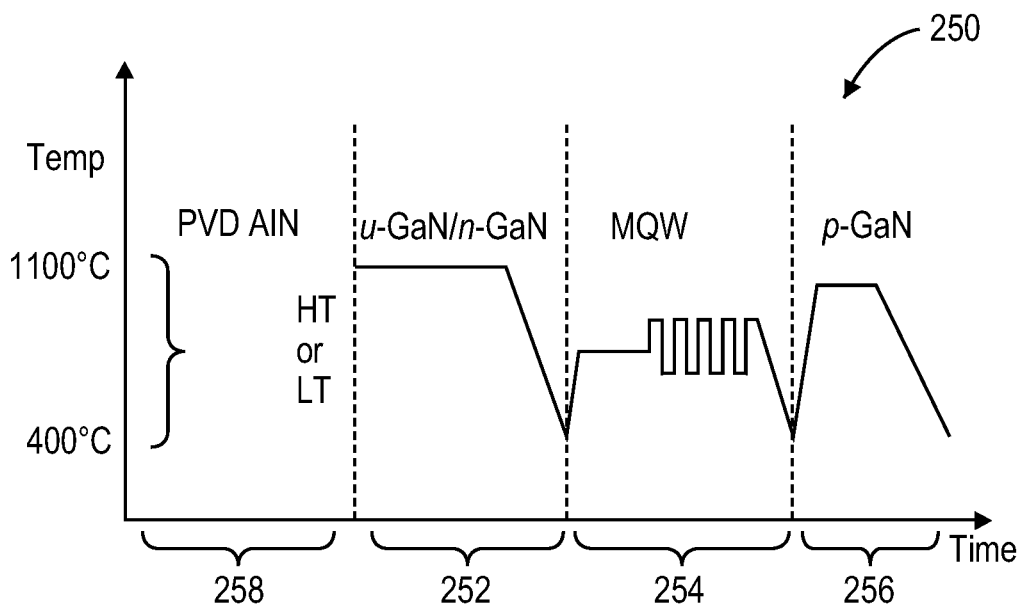
Figure 2B:
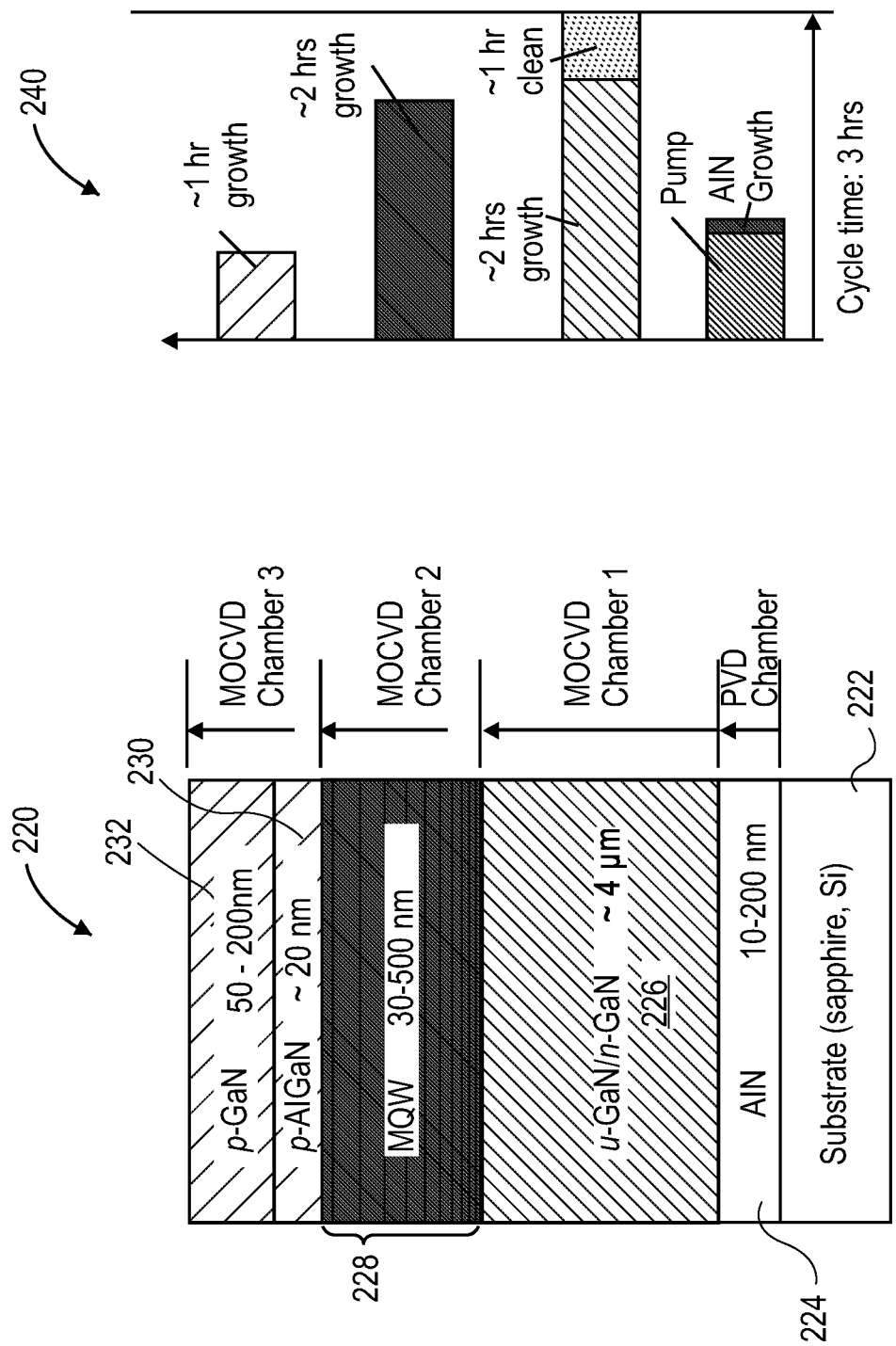
FIG. 2B illustrates a light-emitting diode (LED) structure and a corresponding time-to-deposition plot, in accordance with an embodiment of the present invention.

In an aspect of the present invention, the throughput of a cluster system for fabricating LED or power device structures may be improved by substituting one of or a portion of one of the above described MOCVD material growth capabilities or operations with a PVD sputtering deposition capability or operation. For example, FIG. 2A illustrates a cluster tool schematic and a corresponding temperature versus time plot for LED structure fabrication, in accordance with an embodiment of the present invention. FIG. 2B illustrates an LED structure and a corresponding time-to-deposition plot, in accordance with an embodiment of the present invention.

Referring to FIG. 2A, a cluster tool 200 includes a PVD aluminum nitride sputter chamber 202 (PVD AlN), an un-doped and/or n-type gallium nitride MOCVD reaction chamber 204 (MOCVD1: u-GaN/n-GaN), a multiple quantum well (MQW) MOCVD reaction chamber 206 (MOCVD2: MQW), and a p-type gallium nitride MOCVD reaction chamber 208 (MOCVD3: p-GaN). The cluster tool 200 may also include a load lock 210, a carrier cassette 212, and a transfer chamber 214, all of which are depicted in FIG. 2A.

Thus, in accordance with an embodiment of the present invention, a multi-chamber system includes a PVD chamber having a target of metallic or compound aluminum, and a chamber adapted to deposit un-doped and/or n-type gallium nitride, or both. In one embodiment, the target of the PVD chamber is composed of aluminum nitride. In such an embodiment, reactive sputtering need not be used since the target is composed of the same material desired for deposition. However, in an alternative embodiment, a target composed of aluminum is used, and aluminum nitride is reactively sputtered from the aluminum target by or in the presence of a nitrogen source. In one embodiment, the chamber adapted to deposit un-doped or n-type gallium nitride is a MOCVD chamber, as depicted in FIG. 2A. However, in an alternative embodiment, the chamber adapted to deposit un-doped or n-type gallium nitride is a hydride vapor phase epitaxy (HVPE) chamber. In one embodiment, the PVD chamber and the chamber adapted to deposit un-doped or n-type gallium nitride are included in a cluster tool arrangement, as depicted in FIG. 2A. However, in an alternative embodiment, the PVD chamber and the chamber adapted to deposit un-doped or n-type gallium nitride are included in an in-line tool arrangement. Deposition processes based on PVD, as described herein, may be performed at temperatures approximating standard room temperature, or may be performed at higher temperatures.

Referring to FIG. 2B, an LED structure 220 includes a stack of various material layers, many of which include III-V materials. For example, the LED structure 220 includes a silicon or sapphire substrate 222 (Substrate: sapphire, Si) and an aluminum nitride layer 224 (AlN) with a thickness approximately in the range of 10-200 nanometers. The aluminum nitride layer 224 is formed by sputter deposition in the PVD aluminum nitride sputter chamber 202 of cluster tool 200. The LED structure 220 also includes an approximately 4 microns thick un-doped/n-type gallium nitride combination or n-type gallium nitride-only layer 226 (n-GaN). The un-doped/n-type gallium nitride combination or n-type gallium nitride-only layer 226 is formed in un-doped and/or n-type gallium nitride MOCVD reaction chamber 204 of cluster tool 200. The LED structure 220 also includes an MQW structure 228 with a thickness in the range of 30-500 nanometers. The MQW structure 228 is formed in MQW MOCVD reaction chamber 206 of cluster tool 200. In one embodiment, the MQW structure 228 is composed of one or a plurality of field pairs of InGaN well/GaN barrier material layers. The LED structure 220 also includes an approximately 20 nanometers thick p-type gallium aluminum nitride layer 230 (p-AlGaN) and a p-type gallium nitride layer 232 with a thickness in the range of 50-200 nanometers (p-GaN). The p-type gallium aluminum nitride layer 230 and the p-type gallium nitride layer 232 are formed in p-type gallium nitride MOCVD reaction chamber 208 of cluster tool 200. It is to be understood that the above thicknesses or thickness ranges are exemplary embodiments, and that other suitable thicknesses or thickness ranges are also considered within the spirit and scope of embodiments of the present invention.

A time-to-deposition plot 240 represents chamber usage in cluster tool 200. The formation of the MQW structure 228 in MQW MOCVD reaction chamber 206 has a growth time of approximately 2 hours. The formation of the p-type gallium aluminum nitride layer 230 and the p-type gallium nitride layer 232 in p-type gallium nitride MOCVD reaction chamber 208 has a growth time of approximately 1 hour. And, in accordance with an embodiment of the present invention, the formation of the un-doped/n-type gallium nitride combination or n-type gallium nitride-only layer 226 in un-doped and/or n-type gallium nitride MOCVD reaction chamber 204 has a growth time of only approximately 2 hours. An additional approximately 1 hour may be required for chamber cleaning of chamber 204. It is to be understood, however, that cleaning time may include time for shut-down, plus clean time, plus recovery time. It is also to be understood that the above may represent an average since cleaning may not be performed between every chamber usage.

Thus, instead of forming a buffer layer, such as buffer layer 124 of FIG. 1, in the MOCVD chamber used to form gallium nitride layer 126, an aluminum nitride buffer layer 224 is instead included and is formed in another chamber, specifically in PVD aluminum nitride sputter chamber 202. Although the AlN growth may be for a duration of approximately 5 minutes, excluding pump time (from approximately 400 torr to approximately $10^{-8}$ torr), the formation in a chamber separate from MOCVD chamber 1 increases throughput of cluster tool 200. For example, overall, the cycle time for fabricating LED structure 220 in cluster tool 200 is once again dictated by the cycle time of un-doped and/or n-type gallium nitride MOCVD reaction chamber 204, which is reduced to approximately 3 hours versus the benchmark system of 4.5 hours. As such, the progressive growth of the structure 220 with one PVD chamber in addition to three MOCVD chambers results in much less idle time for the MQW MOCVD reaction chamber 206 and the p-type gallium nitride MOCVD reaction chamber 208, improving the overall throughput of the system 200. For example, in one embodiment, tool throughput is improved from approximately 5.3 runs per day to approximately 8 runs per day, demonstrating an approximately 50% throughput improvement.

Referring again to FIG. 2A, a representative temperature versus time plot 250 for LED structure fabrication in cluster tool 200 is provided. Region 252 of plot 250 is specific to the formation of un-doped/n-type gallium nitride combination or n-type gallium nitride-only layer 226 formed in un-doped and/or n-type gallium nitride MOCVD reaction chamber 204. In this region, only one temperature ramp (ramp down from approximately 1100 degrees Celsius to approximately 400 degrees Celsius) is needed. Such a single ramp event requirement is in stark contrast to the timing sequence for the formation of the buffer layer 124 and the un-doped/n-type gallium nitride combination layer 126 in un-doped and/or n-type gallium nitride MOCVD reaction chamber 102, as described above. In that case, the chamber starts at a high temperature for substrate treatment, ramps down in temperature for buffer layer fabrication, ramps back up in temperature for the gallium nitride deposition, and finally down again for stabilization. It is noted that in both cases, however, the region 254 and 256 of plot 250 specific to the formation of the MQW and the p-GaN, will be approximately the same. In an embodiment, referring to region 258 of plot 250, the temperature versus time plot for PVD-formed aluminum nitride could encompass either a high temperature (HT) or low temperature (LT) process, approximately in the range of 20-1200 degrees Celsius.

In addition to the throughput improvement for cluster tool 200, there may be additional benefits to a PVD chamber plus three MOCVD chamber tool arrangement. For example, cost savings may be achieved since less reaction gas may need to be delivered to the first MOCVD chamber. PVD chamber engineering and design may be simpler compared with configuration time and complexity for an MOCVD chamber dedicated to both a buffer layer and a device layer, as is chamber 102 of benchmark cluster tool 100. In the case that the above process enables a reduced thickness for the un-doped gallium nitride portion of device layer 226, simpler down-the-line etch-back processes may be performed. This may also enable the saving of material and operation cost while reducing cycle time. Also, by using an aluminum nitride buffer layer in place of a gallium nitride buffer layer, reduced defectivity in the active layers of a device, such as an LED device or power device, may be achieved.

Thus, in accordance with an embodiment of the present invention, a multi-chamber system includes a PVD chamber having an aluminum nitride target, and a first MOCVD chamber to deposit un-doped or n-type gallium nitride. The multi-chamber system also includes a second MOCVD chamber to deposit a multiple quantum well (MQW) structure, and a third MOCVD chamber to deposit p-type aluminum gallium nitride or p-type gallium nitride, or both. In one embodiment, the PVD chamber having the aluminum nitride target is for non-reactive sputtering of aluminum nitride. In a specific such embodiment, the PVD chamber is for non-reactive sputtering of aluminum nitride at a low or slightly elevated temperature approximately in the range of 20-200 degrees Celsius. In another specific such embodiment, the PVD chamber is for non-reactive sputtering of aluminum nitride at a high temperature approximately in the range of 200-1200 degrees Celsius. In an alternative embodiment, the PVD chamber is for reactive sputtering of an aluminum target with a nitrogen-containing gas or a plasma derived from a nitrogen-containing gas.

It may be the case that regardless of deposition temperature, a PVD deposited aluminum nitride layer suitable for inclusion in LED structure 220 may need to be, at some point, exposed to a high temperature approximately in the range of 400-1400 degrees Celsius, e.g., about 900 degrees Celsius, in order to achieve requisite material properties (e.g., appropriate defect density, crystal grain size, crystal orientation, etc.). In accordance with an embodiment of the present invention, a rapid thermal processing (RTP) process is performed on the PVD deposited aluminum nitride layer prior to fabrication of additional layers on the aluminum nitride layer. An RTP chamber may, then, in some way be associated with the above described fabrication process for LED structure 220. In one embodiment, a tool, such as a cluster tool or in-line tool including the PVD and three MOCVD chambers also includes a RTP chamber. In an alternative embodiment, however, an RTP process is performed in the PVD chamber. In another alternative embodiment, a laser annealing capability is associated with the above described fabrication process for LED structure 220.

In an aspect of the present invention, then, process conditions for forming a physical vapor deposition (PVD) aluminum nitride (AlN) buffer layer are described. Such a buffer layer may be included in, e.g., a GaN-based device. In an embodiment, a parametric process window is provided for the deposition of AlN with certain characteristic and properties.

In the case of light emitting diode (LED) fabrication, the process typically includes the formation of a low temperature buffer layer via metal organic chemical vapor deposition (MOCVD) on a substrate. Deposition of the buffer layer by MOCVD is typically followed by the formation of active device layers, e.g., un-doped, Si-doped n-type, MQW, and Mg-doped p-type GaN layers. Substrate pre-baking is normally performed at high temperatures (e.g., greater than approximately 1050 degrees Celsius). By contrast, deposition of the buffer layer is normally performed at low temperatures (e.g., approximately in the range of 500-600 degrees Celsius). The processes can account for approximately 10-30% of the total MOCVD process time. The MOCVD throughput may be enhanced by an ex-situ deposited buffer layer. Accordingly, in an embodiment, as described in greater detail below, an ex-situ deposited AlN buffer layer formed by PVD is described. In one embodiment, the PVD process is performed in a separate chamber.

In an embodiment, process conditions are provided for forming a substrate with an AlN buffer (template) suitable for use in GaN device fabrication. In one such embodiment, oxygen controlled deposition of the PVD AlN buffer is performed.

In an embodiment, an AlN buffer layer is formed by reactive sputtering from an aluminum-containing target housed in the PVD chamber and reacted with a nitrogen-containing gas or a plasma based on a nitrogen-containing gas. In one embodiment, oxygen incorporation is also performed. In an exemplary embodiment, one or more (or a combination thereof) of the following operations and conditions are used for the oxygen incorporation: (1) flow of an oxygen containing gas such as, but not limited to, $O_2$, $H_2O$, CO, $CO_2$, NO, $NO_2$, $O_3$, or combinations thereof, into a PVD chamber; (2) the flow of oxygen containing gas prior to, during and/or after the plasma is turned on for deposition so that a chamber, process kit, and target can be pre-conditioned with absorbed oxygen, and/or have an optimal amount of oxygen incorporated at the AlN/substrate interface, in the AlN bulk film and at the AlN surface to render it suitable for high quality GaN growth; and (3) the oxygen containing gas flow amount, introduction time and duration are precisely controlled to ensure its uniform modification interface between the AlN and foreign substrate, in the AlN film and at the AlN surface. In a particular embodiment, the amount of oxygen (O) incorporated in the AlN film is approximately in the range of 1E18 to 1E23 atoms/cm$^3$. In an embodiment, the substrate having AlN deposition thereon is one such as, but not limited to, sapphire, Si, SiC, Si on diamond, ZnO, LiAlO$_2$, MgO, GaAs, copper, W, etc. The substrate may be flat or pre-patterned.

In an embodiment, hardware optimized for oxygen controlled deposition of a PVD AlN buffer layer includes one or more of the following configurations: (1) a pumping system, a chamber vacuum integrating design, and chamber cooling design that together enable a high base vacuum (e.g., 1E-7 torr or less) and a low vacuum leakage with a pressure rate-of-rise (e.g., 2,500 ntorr/min or less) at high temperature, e.g., 350 degrees Celsius or above; (2) a full face erosion magnetron cathode to ensure consistent target erosion and uniform deposition of an AlN film across sample carriers, within and between wafers; (3) a process kit and gas flow design that ensures a uniform distribution of process gases, including 0-containing gas within the chamber so that optimal AlN composition can be achieved uniformly; (4) a high temperature biasable electro-static chuck that ensures fast and uniform heating up of wafers; and (5) inclusion of an Al target doped with oxygen so that optimal amount of oxygen can be uniformly incorporated into the deposited AlN film to ensure high quality GaN growth on top (e.g., in one embodiment, an aluminum target is doped with a concentration of oxygen approximately in the range of 1 ppm-10,000 ppm. In an embodiment, a chamber pasting process is utilized to ensure conditioning of a process kit and target uniformly and sufficiently and provide repeatable PVD AlN properties between pasting cycles. It is to be understood that, in one such embodiment, the number of pasting cycles can vary from one per run to one per target or process kit life. One or more of the above aspects is described below in association with FIGS. 3A-3D.

In one such embodiment, using the above conditions and hardware, deposition of high quality AlN is achieved repeatably from run to run, wafer to wafer and high uniformity within the wafer. On top of the AlN, high quality GaN with XRD (002) FWHM <100 arcsec and/or XRD (102) FWHM <150 arcsec can be grown, and the process has proven repeatability. In a specific embodiment, the GaN has a dislocation density less than approximately 5E8 defects/cm$^2$. In an embodiment, XRD FWHM for (002) is approximately in the range of 50-250 arcsec. In an embodiment, XRD FWHM for (102) is approximately in the range of 70-250 arcsec. In an embodiment, the above described unique hardware and process offer the exceptionally high AlN and GaN quality with high throughput and repeatability.

Exemplary embodiments of tool platforms suitable for housing a PVD chamber along with three MOCVD chambers include an Opus™ AdvantEdge™ system or a Centura™ system, both commercially available from Applied Materials, Inc. of Santa Clara, Calif. Embodiments of the present invention further include an integrated metrology (IM) chamber as a component of the multi-chambered processing platform. The IM chamber may provide control signals to allow adaptive control of integrated deposition process, such as the multiple segmented sputter or epitaxial growth processes such as those described herein. The IM chamber may include a metrology apparatus suitable to measure various film properties, such as thickness, roughness, composition, and may further be capable of characterizing grating parameters such as critical dimensions (CD), sidewall angle (SWA), feature height (HT) under vacuum in an automated manner. Examples include, but are not limited to, optical techniques like reflectometry and scatterometry. In particularly advantageous embodiments, in-vacuo optical CD (OCD) techniques are employed where the attributes of a grating formed in a starting material are monitored as the sputter and/or epitaxial growth proceeds. In other embodiments, metrology operations are performed in a process chamber, e.g., in-situ in the process chamber, rather than in a separate IM chamber.

A multi-chambered processing platform, such as cluster tool 200 may further include an optional substrate aligner chamber, as well as load lock chambers holding cassettes, coupled to a transfer chamber including a robotic handler. In one embodiment of the present invention, adaptive control of the multi-chambered processing platform 200 is provided by a controller. The controller may be one of any form of general-purpose data processing system that can be used in an industrial setting for controlling the various subprocessors and subcontrollers. Generally, the controller includes a central processing unit (CPU) in communication with a memory and an input/output (I/O) circuitry, among other common components. As an example, the controller may perform or otherwise initiate one or more of the operations of any of the methods/processes described herein. Any computer program code that performs and/or initiates such operations may be embodied as a computer program product. Each computer program product described herein may be carried by a medium readable by a computer (e.g., a floppy disc, a compact disc, a DVD, a hard drive, a random access memory, etc.).

Suitable PVD chambers for the processes and tool configurations contemplated herein may include the Applied Materials Endura® Impulse™ PVD system, commercially available from Applied Materials, Inc. of Santa Clara, Calif. The Endura PVD system provides superior electromigration resistance and surface morphology as well as low cost of ownership and high system reliability. PVD processes performed therein may be done so at requisite pressures and suitable target-to-wafer distance which creates directional flux of deposited species in the process cavity. Chambers compatible with in-line systems such as the ARISTO chamber, also commercially available from Applied Materials, Inc. of Santa Clara, Calif., provides automated loading and unloading capabilities, as well as a magnetic carrier transport system, permitting significantly reduced cycle times. The AKT-PiVot 55 KV PVD system, also commercially available from Applied Materials, Inc. of Santa Clara, Calif., has a vertical platform for sputtering deposition. The AKT-PiVot system's module architecture delivers significantly faster cycle time and enables a large variety of configurations to maximize production efficiency. Unlike traditional in-line systems, the AKT-PiVot's parallel processing capability eliminates bottlenecks caused by different process times for each film layer. The system's cluster-like arrangement also allows continuous operation during individual module maintenance. The included rotary cathode technology enables nearly 3× higher target utilization as compared with conventional systems. The PiVot system's deposition modules feature a pre-sputter unit that enables target conditioning using only one substrate, rather than up to 50 substrates that are needed with other systems to achieve the same results.

Figure 3A:
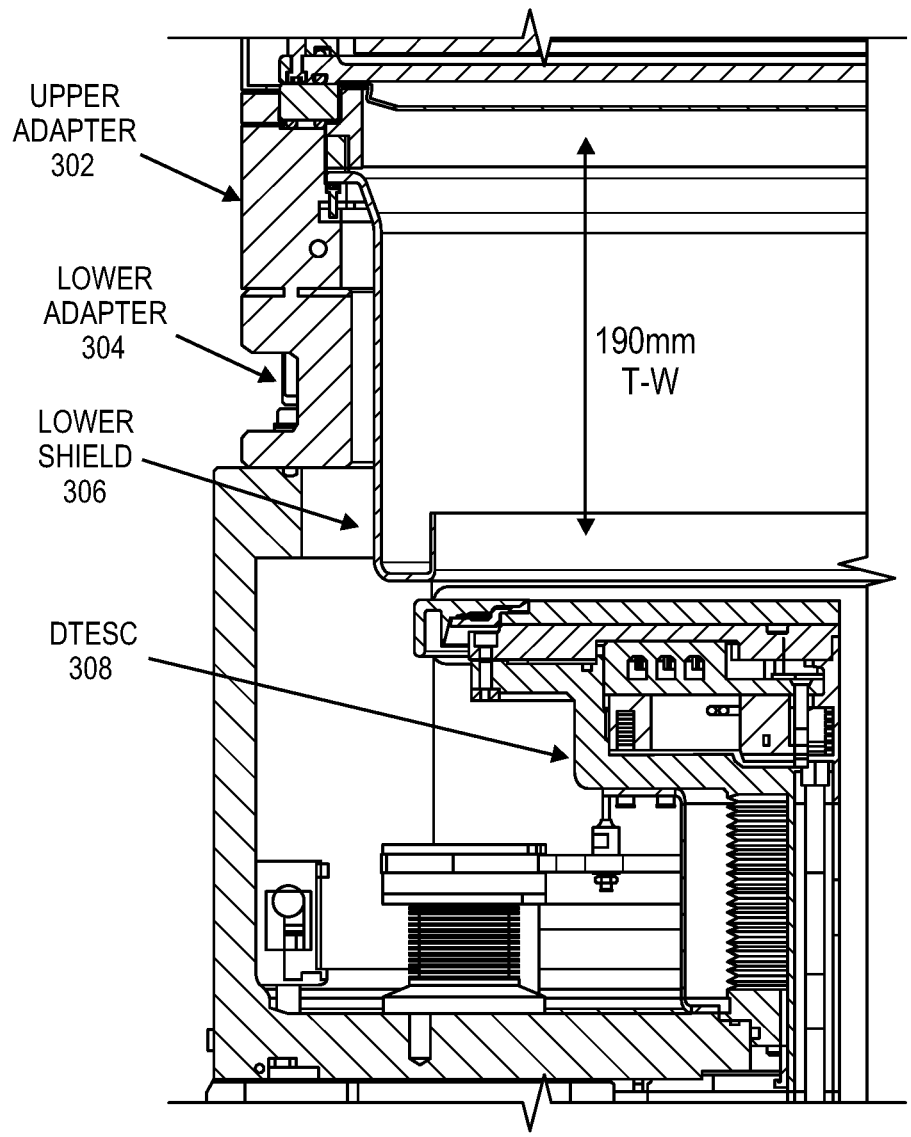
FIGS. 3A-3C illustrate cross-sectional views of a process kit for a PVD chamber, in accordance with an embodiment of the present invention.
Figure 3B:
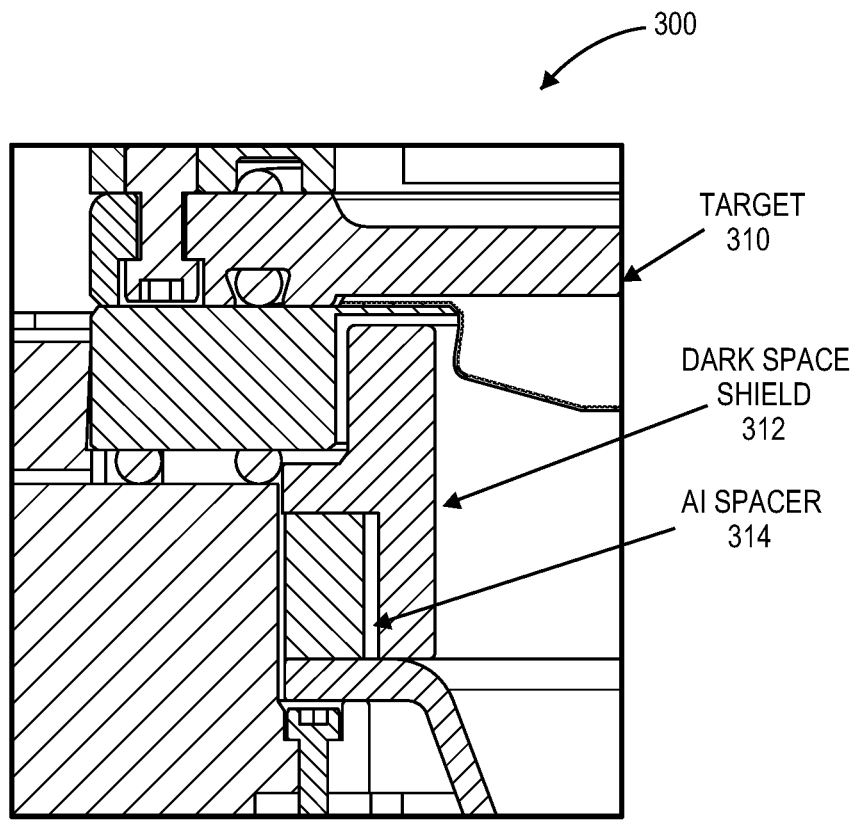
Figure 3C:
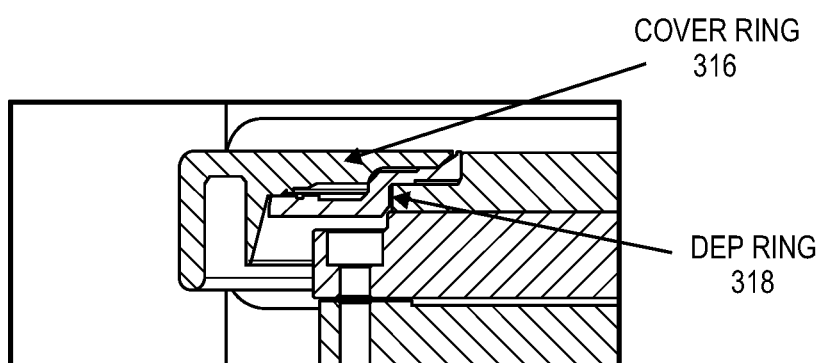
Figure 3D:
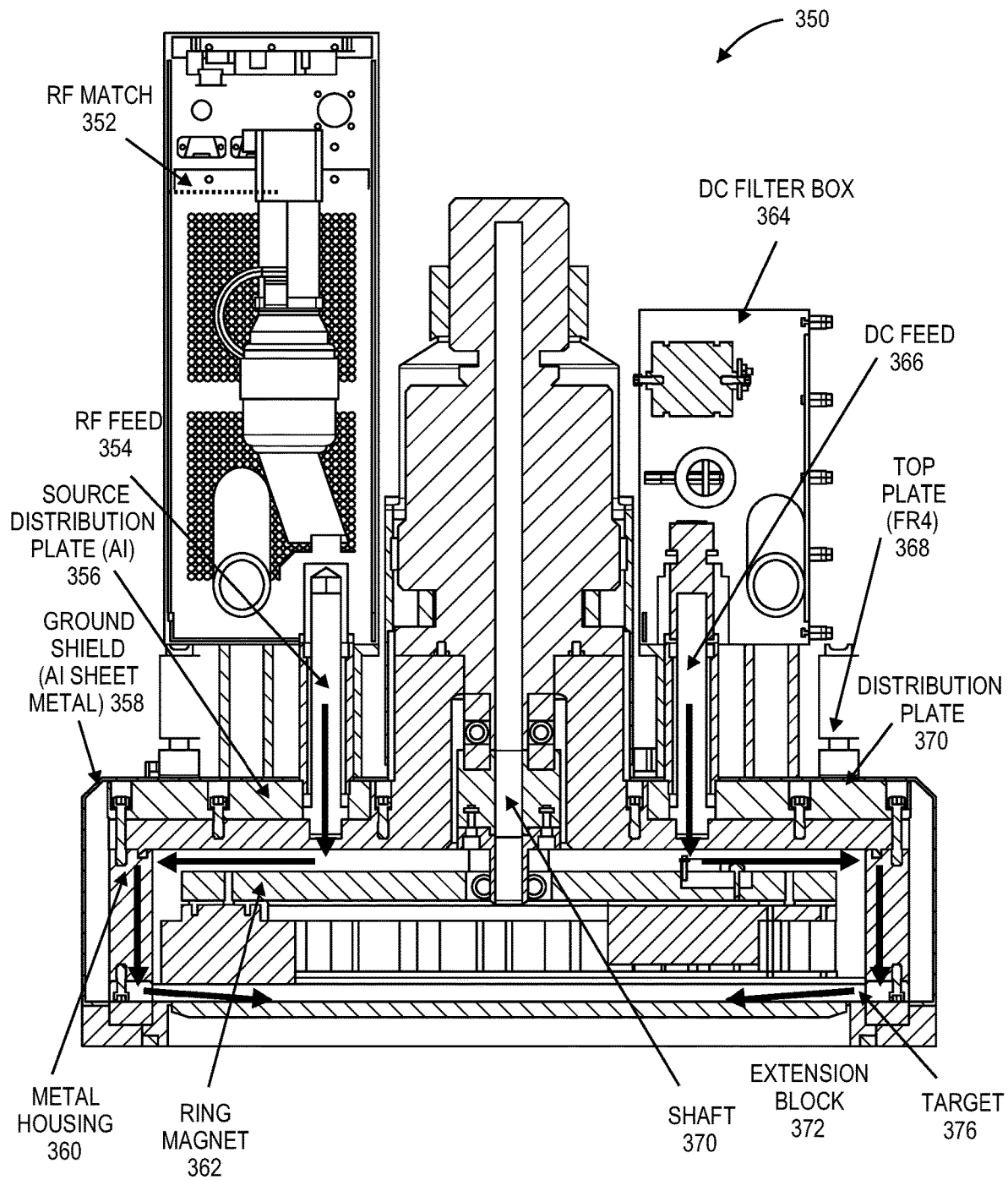
FIG. 3D illustrates a cross-sectional view of a power delivery source for a PVD chamber, in accordance with an embodiment of the present invention.

In an aspect of the present invention, designing a proper process kit may be important for Pulsed DC or RF chamber functionality in a PVD process chamber. As an example, FIGS. 3A-3C illustrate cross-sectional views of a process kit for a PVD chamber, in accordance with an embodiment of the present invention. FIG. 3D illustrates a cross-sectional view of a power delivery source for a PVD chamber, in accordance with an embodiment of the present invention.

Referring to FIGS. 3A-3C, a process kit 300 for a PVD chamber includes a first portion (FIG. 3A) with an upper adapter 302, a lower adapter 304, a lower shield 306, and a DTESC 308. The process kit 300 for the PVD chamber also includes a second portion (FIG. 3B) with a target 310, a dark space shield 312 and an Al spacer 314. The process kit 300 for the PVD chamber also includes a third portion (FIG. 3C) with a cover ring 316 and a deposition ring 318.

Referring to FIG. 3D, a power delivery source 350 for a PVD chamber includes an RF match 352 and an RF feed 354. A source distribution plate 356 (e.g., an aluminum source distribution plate) and a ground shield 358 (e.g., aluminum sheet metal) are also included, along with a metal housing 360 and a ring magnet 362. The power delivery source 350 also includes a DC filter box 364 and a DC feed 366. A top plate 368 and a distribution plate 370 are also included, along with an extension block 372, a shaft 374, and a target 376.

Figure 4:
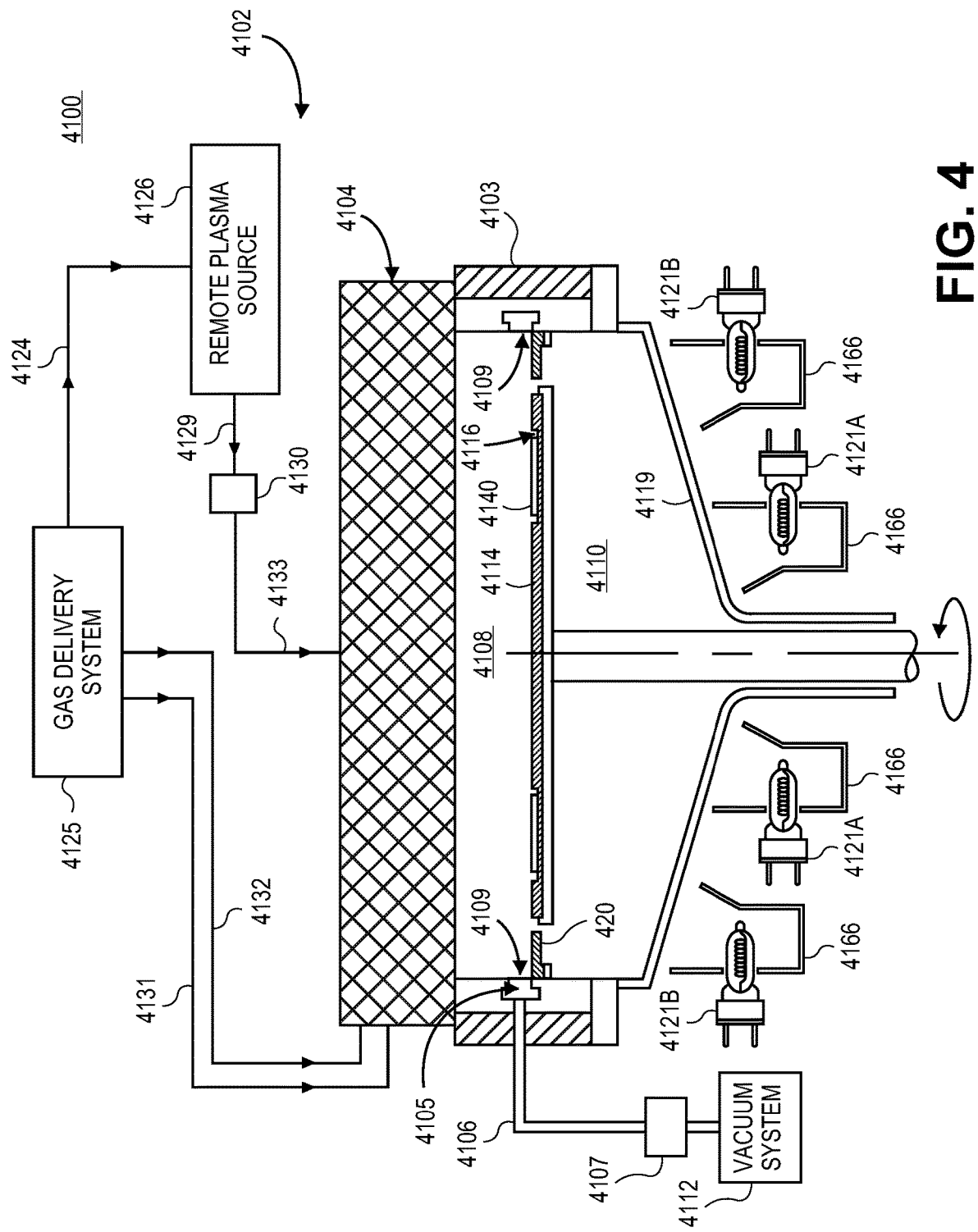
FIG. 4 is a schematic cross-sectional view of a MOCVD chamber suitable for the fabrication of group III-nitride materials, in accordance with an embodiment of the present invention.

An example of an MOCVD deposition chamber which may be suitable for use as one or more of MOCVD chambers 204, 206, or 208, described above, is illustrated and described with respect to FIG. 4. FIG. 4 is a schematic cross-sectional view of an MOCVD chamber according to an embodiment of the invention.

The apparatus 4100 shown in FIG. 4 includes a chamber 4102, a gas delivery system 4125, a remote plasma source 4126, and a vacuum system 4112. The chamber 4102 includes a chamber body 4103 that encloses a processing volume 4108. A showerhead assembly 4104 is disposed at one end of the processing volume 4108, and a substrate carrier 4114 is disposed at the other end of the processing volume 4108. A lower dome 4119 is disposed at one end of a lower volume 4110, and the substrate carrier 4114 is disposed at the other end of the lower volume 4110. The substrate carrier 4114 is shown in process position, but may be moved to a lower position where, for example, the substrates 4140 may be loaded or unloaded. An exhaust ring 420 may be disposed around the periphery of the substrate carrier 4114 to help prevent deposition from occurring in the lower volume 4110 and also help direct exhaust gases from the chamber 4102 to exhaust ports 4109. The lower dome 4119 may be made of transparent material, such as high-purity quartz, to allow light to pass through for radiant heating of the substrates 4140. The radiant heating may be provided by a plurality of inner lamps 4121A and outer lamps 4121B disposed below the lower dome 4119, and reflectors 4166 may be used to help control chamber 4102 exposure to the radiant energy provided by inner and outer lamps 4121A, 4121B. Additional rings of lamps may also be used for finer temperature control of the substrate 4140.

The substrate carrier 4114 may include one or more recesses 4116 within which one or more substrates 4140 may be disposed during processing. The substrate carrier 4114 may carry six or more substrates 4140. In one embodiment, the substrate carrier 4114 carries eight substrates 4140. It is to be understood that more or less substrates 4140 may be carried on the substrate carrier 4114. Typical substrates 4140 may include sapphire, silicon carbide (SiC), silicon, or gallium nitride (GaN). It is to be understood that other types of substrates 4140, such as glass substrates 4140, may be processed. Substrate 4140 size may range from 50 mm-100 mm in diameter or larger. The substrate carrier 4114 size may range from 200 mm-750 mm. The substrate carrier 4114 may be formed from a variety of materials, including SiC or SiC-coated graphite. It is to be understood that substrates 4140 of other sizes may be processed within the chamber 4102 and according to the processes described herein. The showerhead assembly 4104 may allow for more uniform deposition across a greater number of substrates 4140 and/or larger substrates 4140 than in traditional MOCVD chambers, thereby increasing throughput and reducing processing cost per substrate 4140.

The substrate carrier 4114 may rotate about an axis during processing. In one embodiment, the substrate carrier 4114 may be rotated at about 2 RPM to about 100 RPM. In another embodiment, the substrate carrier 4114 may be rotated at about 30 RPM. Rotating the substrate carrier 4114 aids in providing uniform heating of the substrates 4140 and uniform exposure of the processing gases to each substrate 4140.

The plurality of inner and outer lamps 4121A, 4121B may be arranged in concentric circles or zones (not shown), and each lamp zone may be separately powered. In one embodiment, one or more temperature sensors, such as pyrometers (not shown), may be disposed within the showerhead assembly 4104 to measure substrate 4140 and substrate carrier 4114 temperatures, and the temperature data may be sent to a controller (not shown) which can adjust power to separate lamp zones to maintain a predetermined temperature profile across the substrate carrier 4114. In another embodiment, the power to separate lamp zones may be adjusted to compensate for precursor flow or precursor concentration non-uniformity. For example, if the precursor concentration is lower in a substrate carrier 4114 region near an outer lamp zone, the power to the outer lamp zone may be adjusted to help compensate for the precursor depletion in this region.

The inner and outer lamps 4121A, 4121B may heat the substrates 4140 to a temperature of about 400 degrees Celsius to about 1200 degrees Celsius. It is to be understood that the invention is not restricted to the use of arrays of inner and outer lamps 4121A, 4121B. Any suitable heating source may be utilized to ensure that the proper temperature is adequately applied to the chamber 4102 and substrates 4140 therein. For example, in another embodiment, the heating source may include resistive heating elements (not shown) which are in thermal contact with the substrate carrier 4114.

A gas delivery system 4125 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 4102. Different gases, such as precursor gases, carrier gases, purge gases, cleaning/etching gases or others may be supplied from the gas delivery system 4125 to separate supply lines 4131, 4132, and 4133 to the showerhead assembly 4104. The supply lines 4131, 4132, and 4133 may include shut-off valves and mass flow controllers or other types of controllers to monitor and regulate or shut off the flow of gas in each line.

A conduit 4129 may receive cleaning/etching gases from a remote plasma source 4126. The remote plasma source 4126 may receive gases from the gas delivery system 4125 via supply line 4124, and a valve 4130 may be disposed between the showerhead assembly 4104 and remote plasma source 4126. The valve 4130 may be opened to allow a cleaning and/or etching gas or plasma to flow into the showerhead assembly 4104 via supply line 4133 which may be adapted to function as a conduit for a plasma. In another embodiment, apparatus 4100 may not include remote plasma source 4126 and cleaning/etching gases may be delivered from gas delivery system 4125 for non-plasma cleaning and/or etching using alternate supply line configurations to shower head assembly 4104.

The remote plasma source 4126 may be a radio frequency or microwave plasma source adapted for chamber 4102 cleaning and/or substrate 4140 etching. Cleaning and/or etching gas may be supplied to the remote plasma source 4126 via supply line 4124 to produce plasma species which may be sent via conduit 4129 and supply line 4133 for dispersion through showerhead assembly 4104 into chamber 4102. Gases for a cleaning application may include fluorine, chlorine or other reactive elements.

In another embodiment, the gas delivery system 4125 and remote plasma source 4126 may be suitably adapted so that precursor gases may be supplied to the remote plasma source 4126 to produce plasma species which may be sent through showerhead assembly 4104 to deposit CVD layers, such as Group films, for example, on substrates 4140. In general, a plasma, which is a state of matter, is created by the delivery of electrical energy or electromagnetic waves (e.g., radio frequency waves, microwaves) to a process gas (e.g., precursor gases) to cause it to at least partially breakdown to form plasma species, such as ions, electrons and neutral particles (e.g., radicals). In one example, a plasma is created in an internal region of the plasma source 4126 by the delivery electromagnetic energy at frequencies less than about 100 gigahertz (GHz). In another example, the plasma source 4126 is configured to deliver electromagnetic energy at a frequency between about 0.4 kilohertz (kHz) and about 200 megahertz (MHz), such as a frequency of about 162 megahertz (MHz), at a power level less than about 4 kilowatts (kW). It is believed that the formed plasma enhances the formation and activity of the precursor gas(es) so that the activated gases, which reach the surface of the substrate(s) during the deposition process can rapidly react to form a layer that has improved physical and electrical properties.

A purge gas (e.g., nitrogen) may be delivered into the chamber 4102 from the showerhead assembly 4104 and/or from inlet ports or tubes (not shown) disposed below the substrate carrier 4114 and near the bottom of the chamber body 4103. The purge gas enters the lower volume 4110 of the chamber 4102 and flows upwards past the substrate carrier 4114 and exhaust ring 420 and into multiple exhaust ports 4109 which are disposed around an annular exhaust channel 4105. An exhaust conduit 4106 connects the annular exhaust channel 4105 to a vacuum system 4112 which includes a vacuum pump (not shown). The chamber 4102 pressure may be controlled using a valve system 4107 which controls the rate at which the exhaust gases are drawn from the annular exhaust channel 4105.

Figure 5:
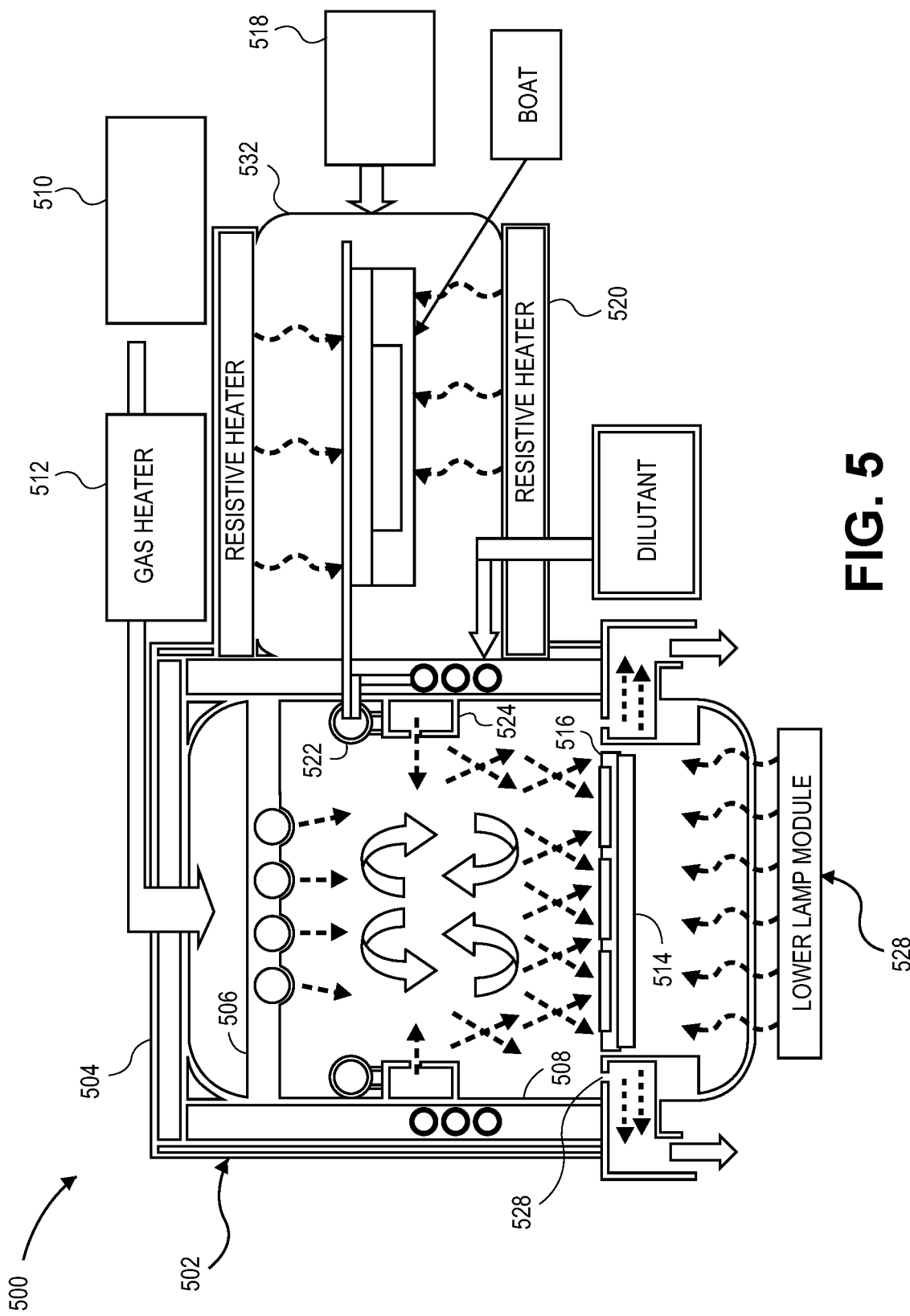
FIG. 5 is a schematic cross-sectional view of a HVPE chamber suitable for the fabrication of group III-nitride materials, in accordance with an embodiment of the present invention.

An example of a HVPE deposition chamber which may be suitable for use as the HVPE chamber 204 of alternative embodiments of chamber 204 (or of alternative embodiments for other chambers), described above, is illustrated and described with respect to FIG. 5. FIG. 5 is a schematic cross-sectional view of a HVPE chamber 500 suitable for the fabrication of group III-nitride materials, in accordance with an embodiment of the present invention.

The apparatus 500 includes a chamber 502 enclosed by a lid 504. Processing gas from a first gas source 510 is delivered to the chamber 502 through a gas distribution showerhead 506. In one embodiment, the gas source 510 includes a nitrogen containing compound. In another embodiment, the gas source 510 includes ammonia. In one embodiment, an inert gas such as helium or diatomic nitrogen is introduced as well either through the gas distribution showerhead 506 or through the walls 508 of the chamber 502. An energy source 512 may be disposed between the gas source 510 and the gas distribution showerhead 506. In one embodiment, the energy source 512 includes a heater. The energy source 512 may break up the gas from the gas source 510, such as ammonia, so that the nitrogen from the nitrogen containing gas is more reactive.

To react with the gas from the first source 510, precursor material may be delivered from one or more second sources 518. The precursor may be delivered to the chamber 502 by flowing a reactive gas over and/or through the precursor in the precursor source 518. In one embodiment, the reactive gas includes a chlorine containing gas such as diatomic chlorine. The chlorine containing gas may react with the precursor source to form a chloride. In order to increase the effectiveness of the chlorine containing gas to react with the precursor, the chlorine containing gas may snake through the boat area in the chamber 532 and be heated with the resistive heater 520. By increasing the residence time that the chlorine containing gas is snaked through the chamber 532, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactivity of the precursor, the precursor may be heated by a resistive heater 520 within the second chamber 532 in a boat. The chloride reaction product may then be delivered to the chamber 502. The reactive chloride product first enters a tube 522 where it evenly distributes within the tube 522. The tube 522 is connected to another tube 524. The chloride reaction product enters the second tube 524 after it has been evenly distributed within the first tube 522. The chloride reaction product then enters into the chamber 502 where it mixes with the nitrogen containing gas to form a nitride layer on a substrate 516 that is disposed on a susceptor 514. In one embodiment, the susceptor 514 includes silicon carbide. The nitride layer may include n-type gallium nitride for example. The other reaction products, such as nitrogen and chlorine, are exhausted through an exhaust 526.

LEDs and related devices may be fabricated from layers of, e.g., group III-V films, especially group III-nitride films. Some embodiments of the present invention relate to forming gallium nitride (GaN) layers in a dedicated chamber of a fabrication tool, such as in a dedicated MOCVD chamber. In some embodiments of the present invention, GaN is a binary GaN film, but in other embodiments, GaN is a ternary film (e.g., InGaN, AlGaN) or is a quaternary film (e.g., InAlGaN). In at least some embodiments, the group III-nitride material layers are formed epitaxially. They may be formed directly on a substrate or on a buffers layer disposed on a substrate. Other contemplated embodiments include p-type doped gallium nitride layers deposited directly on PVD-formed buffer layers, e.g., PVD-formed aluminum nitride.

It is to be understood that embodiments of the present invention are not limited to formation of layers on the select substrates described above. Other embodiments may include the use of any suitable non-patterned or patterned single crystalline substrate upon which a high quality aluminum nitride layer may be sputter-deposited, e.g., in a non-reactive PVD approach. The substrate may be one such as, but not limited to, a sapphire ($Al_2O_3$) substrate, a silicon (Si) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate, and a lithium aluminum oxide ($LiAlO_2$) substrate. Any well know method, such as masking and etching may be utilized to form features, such as posts, from a planar substrate to create a patterned substrate. In a specific embodiment, however, a patterned sapphire substrate (PSS) is used with a (0001) orientation. Patterned sapphire substrates may be preferred for use in the manufacturing of certain types of LEDs because they increase the light extraction efficiency which is extremely useful in the fabrication of a new generation of solid state lighting devices. Substrate selection criteria may include lattice matching to mitigate defect formation and coefficient of thermal expansion (CTE) matching to mitigate thermal stresses.

As described above, the group III-nitride films can be doped. The group III-nitride films can be p-typed doped using any p-type dopant such as but not limited Mg, Be, Ca, Sr, or any Group I or Group II element have two valence electrons. The group III-nitride films can be p-type doped to a conductivity level of between $1\times10^{16}$ to $1\times10^{20}$ atoms/$cm^3$. The group III-nitride films can be n-typed doped using any n-type dopant such as but not limited silicon or oxygen, or any suitable Group IV or Group VI element. The group III-nitride films can be n-type doped to a conductivity level of between $1\times10^{16}$ to $1\times10^{20}$ atoms/$cm^3$.

It is to be understood that the above processes may be performed in a dedicated chamber within a cluster tool, or other tool with more than one chamber, e.g. an in-line tool arranged to have a dedicated chamber for fabricating layers of an LED. It is also to be understood that embodiments of the present invention need not be limited to the fabrication of LEDs. For example, in another embodiment, devices other than LED devices may be fabricated by approaches described herein, such as but not limited to field-effect transistor (FET) devices, or power devices. In such embodiments, there may not be a need for a p-type material on top of a structure of layers. Instead, an n-type or un-doped material may be used in place of the p-type layer. It is also to be understood that multiple operations, such as various combinations of depositing and/or thermal annealing, may be performed in a single process chamber.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
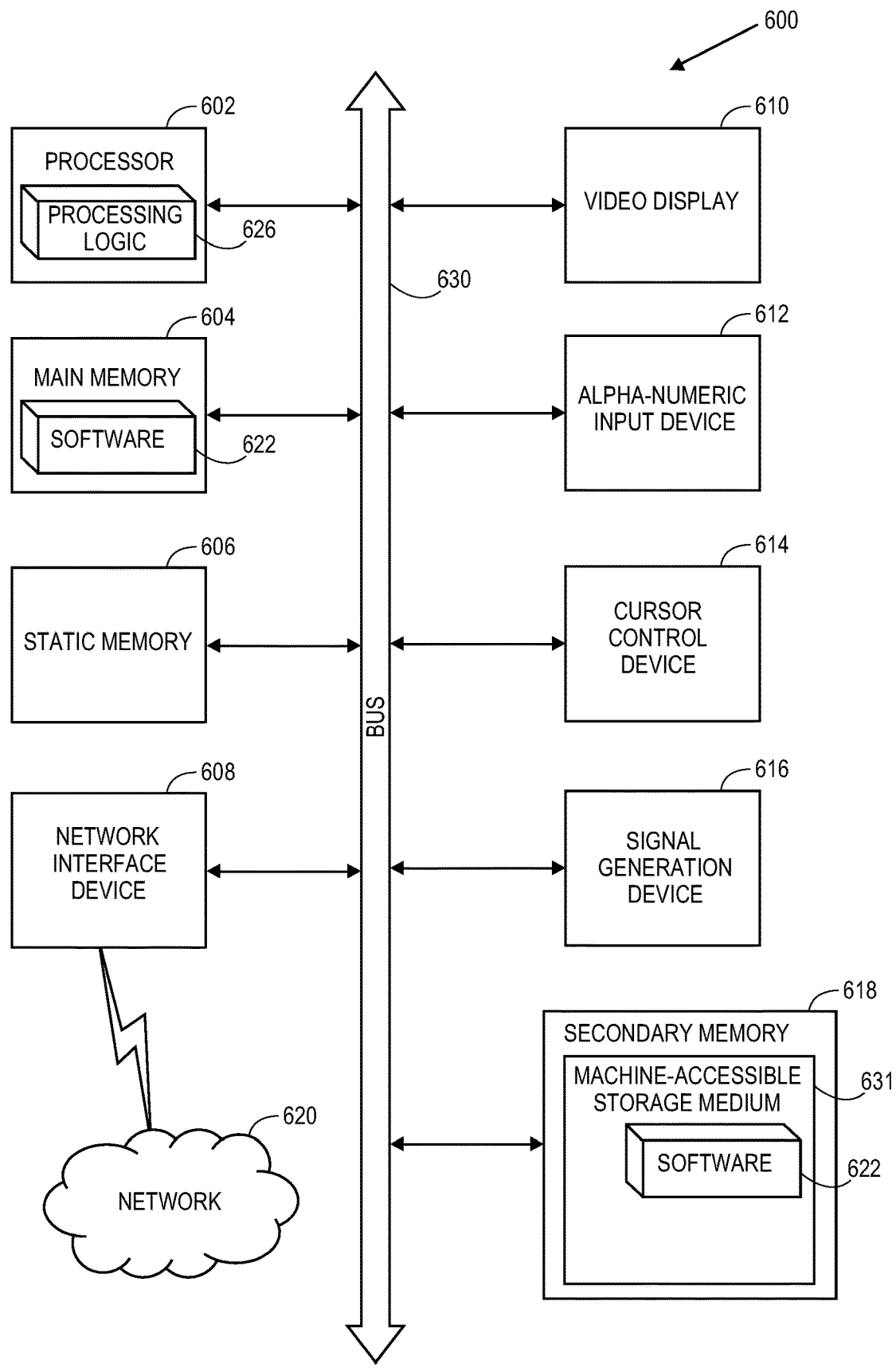
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use a computing device for an apparatus described in association with FIG. 1, 2A, 3A, 3B, 4 or 5, described above.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a non-transitory machine-accessible storage medium has instructions stored thereon which cause a data processing system to perform a method of forming a PVD AlN buffer for GaN-based optoelectronic and electronic devices in an oxygen controlled manner.

Thus, oxygen controlled PVD AlN buffer for GaN-based optoelectronic and electronic devices has been disclosed.

What is claimed is:

1. A method, comprising: forming an AlN layer above a substrate; and incorporating oxygen into the AlN layer including at an interface between the AlN layer and the substrate by flowing an oxygen-containing gas during forming the AlN layer, wherein the flowing the oxygen-containing gas begins after the beginning of forming the AlN layer.

2. The method of claim 1, wherein forming the AlN layer comprises reacting an aluminum-containing target with a nitrogen-containing gas.

3. The method of claim 1, wherein forming the AlN layer comprises reacting an aluminum-containing target with a plasma based on a nitrogen-containing gas.

4. The method of claim 1, wherein incorporating oxygen into the AlN layer comprises incorporating a concentration of oxygen approximately in the range of 1E18 to 1E23 cm-3 into the AlN layer.

5. The method of claim 1, wherein incorporating oxygen into the AlN layer further comprises incorporating oxygen into a bulk portion of the AlN layer.

6. The method of claim 1, wherein incorporating oxygen into the AlN layer further comprises incorporating oxygen into a surface of the AlN layer.

7. The method of claim 1, further comprising: forming a GaN layer on the AlN layer.

8. The method of claim 1, wherein the substrate is selected from the group consisting of sapphire, Si, SiC, Si on diamond, ZnO, $LiAlO_2$, MgO, GaAs, Copper and W.

* * * * *